US008674732B1

(12) United States Patent
Fang

(10) Patent No.: US 8,674,732 B1
(45) Date of Patent: Mar. 18, 2014

(54) EDGE DENSITY DETECTION

(71) Applicant: Xilinx, Inc., San Jose, CA (US)

(72) Inventor: Wayne Fang, Pleasanton, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 13/830,590

(22) Filed: Mar. 14, 2013

(51) Int. Cl.
*H03L 7/06* (2006.01)

(52) U.S. Cl.
USPC .......................................... 327/157; 327/148

(58) Field of Classification Search
USPC ................................................ 327/148, 157
See application file for complete search history.

(56) References Cited

U.S. PATENT DOCUMENTS

| 6,704,383 | B2* | 3/2004 | Lee et al. ....................... 375/376 |
| 7,184,503 | B2* | 2/2007 | Wong et al. .................... 375/354 |
| 7,719,331 | B2* | 5/2010 | Kobayashi ..................... 327/158 |
| 8,421,507 | B2* | 4/2013 | Hsieh et al. .................... 327/156 |
| 8,487,675 | B2* | 7/2013 | Hsieh et al. .................... 327/156 |
| 2006/0119405 | A1* | 6/2006 | Kobayashi ..................... 327/158 |
| 2010/0171776 | A1* | 7/2010 | Yamagata et al. ............. 345/691 |
| 2012/0119801 | A1* | 5/2012 | Hsieh et al. .................... 327/156 |

OTHER PUBLICATIONS

U.S. Appl. No. 13/830,729, filed Mar. 14, 2013, Chien et al.
Deng, Wei et al., "A 0.022 mm² 970μW Dual-Loop Injection-Locked PLL with -243dB FOM Using Synthesizable All-Digital PVT Calibration Circuits," *Proc. of the 2013 IEEE International Solid-State Circuits Conference*, Feb. 17, 2013, pp. 248-249, IEEE, Piscataway, New Jersey, USA.
Elshazly, Amr et al., "A 1.5GHz 890μW Digital MDLL with 400fs$_{rms}$ Integrated Jitter, -55.6dBc Reference Spur and 20fs/mV Supply-Noise Sensitivity using 1b TDS," *Proc. of the 2012 IEEE International Solid-State Circuits Conference*, Feb. 19, 2012, pp. 242-243, IEEE, Piscataway, New Jersey, USA.
Huang, Yi-Chieh et al., "A 2.4GHz Sub-Harmonically Injection-Locked PLL With Self-Calibrated Injection Timing," *Proc. of the 2012 IEEE International Solid-State Circuits Conference*, Feb. 19, 2012, pp. 338-339, IEEE, Piscataway, New Jersey, USA.
Lee, Jri et al., "Study of Subharmonically Injection-Locked PLLs," *IEEE Journal of Solid-State Circuits* May 2009, vol. 44, No. 5, pp. 1539-1553, IEEE, Piscataway, New Jersey, USA.
Lee, I-Ting et al., "A Divider-Less Sub-Harmonically Injection-Locked PLL with Self-Adjusted Injection Timing," *Proc. of the 2013 IEEE International Solid-State Circuits Conference*, Feb. 17, 2013, pp. 248-249, IEEE, Piscataway, New Jersey, USA.

* cited by examiner

*Primary Examiner* — Adam Houston
(74) *Attorney, Agent, or Firm* — W. Eric Webostad

(57) ABSTRACT

An edge density detector is disclosed. This edge density detector is to receive a reference frequency signal and a feedback frequency signal. This edge density detector includes a first pulse generator, a second pulse generator, and a charge pump. The first pulse generator is coupled to receive the reference frequency signal and is configured to generate a first pulse signal. The second pulse generator is coupled to receive the feedback frequency signal and is configured to generate a second pulse signal. The charge pump is coupled to receive the first pulse signal and the second pulse signal to provide a control voltage signal. The control voltage signal is a phase independent with respect to the reference frequency signal and the feedback frequency signal.

20 Claims, 4 Drawing Sheets

US 8,674,732 B1

EDGE DENSITY DETECTION

TECHNICAL FIELD

The following description relates to integrated circuit devices ("ICs"). More particularly, the following description relates to edge density detection for an IC.

BACKGROUND

A voltage controlled oscillator ("VCO") has a natural frequency of operation. However, this natural frequency of operation may be different from a frequency of operation of a reference frequency signal, such as for example a reference clock signal. In some applications, this frequency offset may induce a static phase offset ("SPO") at the output of a clock generation block. A conventional phase-frequency detector ("PFD") can attempt to lock to both frequency and phase of such a reference clock signal. However, a problem may result in situations where phase locking is not required or necessary due to contention. Accordingly, it would be useful to provide a signal that is independent of phase for such situations.

SUMMARY

An apparatus relates generally to an edge density detector. In such an apparatus, the edge density detector is to receive a reference frequency signal and a feedback frequency signal. The edge density detector includes a first pulse generator, a second pulse generator, and a charge pump. The first pulse generator is coupled to receive the reference frequency signal and is configured to generate a first pulse signal. The second pulse generator is coupled to receive the feedback frequency signal and is configured to generate a second pulse signal. The charge pump is coupled to receive the first pulse signal and the second pulse signal to provide a control voltage signal. The control voltage signal is a phase independent with respect to the reference frequency signal and the feedback frequency signal.

Another apparatus relates generally to a frequency lock loop. In such an apparatus, an edge density detector is coupled to receive a reference frequency signal and a feedback frequency signal. The edge density detector includes: a first pulse generator, a second pulse generator, and a charge pump. The first pulse generator is coupled to receive the reference frequency signal and is configured to generate a first pulse signal. The second pulse generator is coupled to receive the feedback frequency signal and is configured to generate a second pulse signal. The charge pump is coupled to receive the first pulse signal and the second pulse signal to provide a control voltage signal. The control voltage signal is a phase independent with respect to the reference frequency signal and the feedback frequency signal.

A method relates generally to generating a control voltage signal. In such a method, a reference frequency signal is obtained and a feedback frequency signal is generated responsive to the reference frequency signal. The feedback frequency signal is provided using a voltage controlled oscillator. First pulses associated with first edge information are generated for the reference frequency signal. Second pulses associated with a second edge information are generated for the feedback frequency signal. The control voltage signal is generated responsive to the first pulses and the second pulses. The control voltage signal represents an edge density relationship between the first edge information and the second edge information. The generating of the control voltage signal includes adjusting the control voltage signal output toward a match in edge densities respectively associated with the first edge information and the second edge information.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
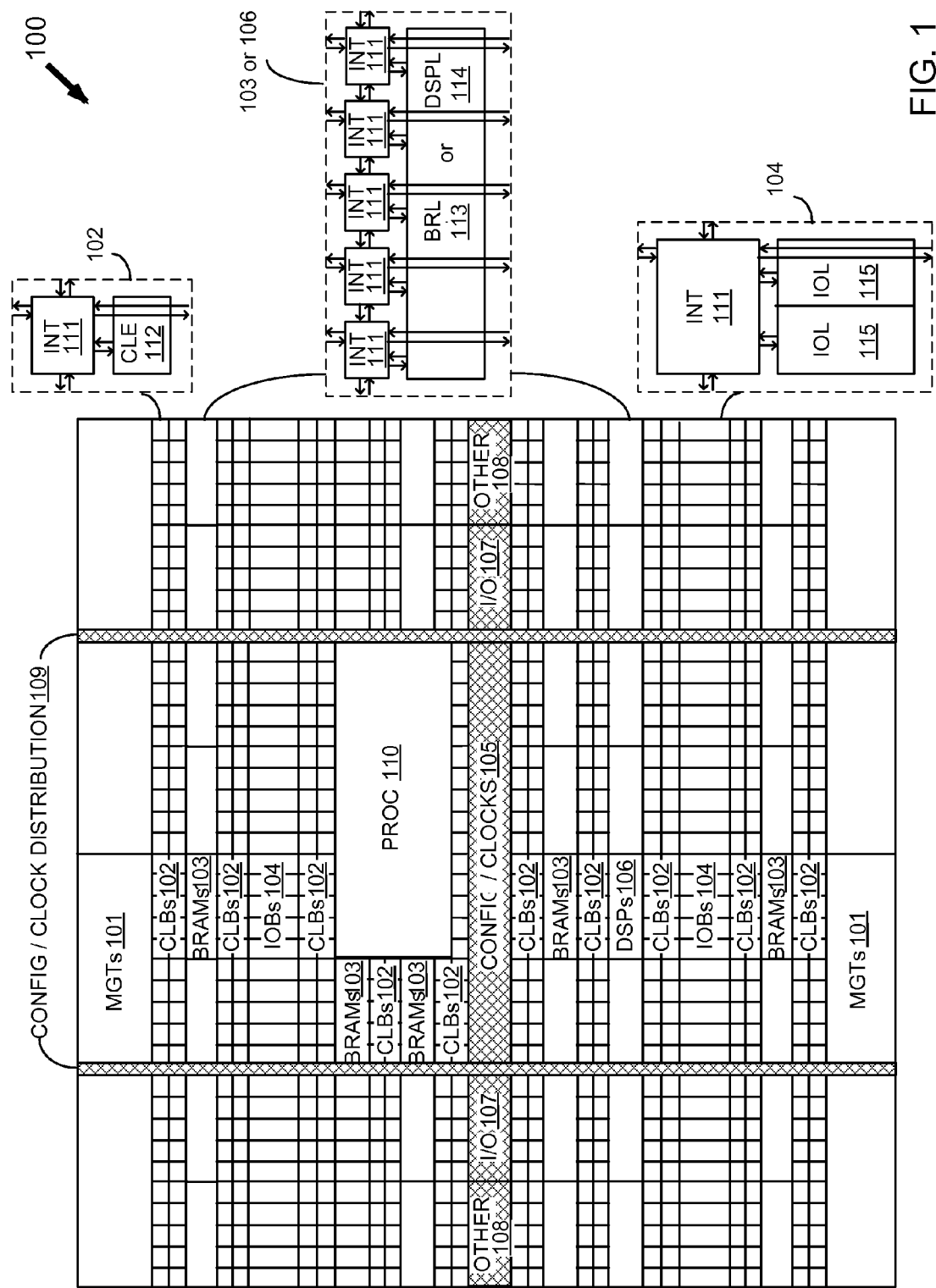
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

To provide a frequency-locked loop ("FLL"), a conventional phase-frequency detector ("PFD") may be used to determine whether frequency is locked or not. However, for an injection-locked phase-locked loop ("IL-PLL"), a conventional PFD of a PLL may cause contention with an injection pulse signal due to phase offset.

To generate a phase independent signal, an edge density detector, as described below in additional detail, may be used. Effectively, to overcome phase locking of a PFD of a locked-loop, another PFD may be used in parallel. Such parallel PFDs may feed an accumulator, which may be a charge pump, to provide a phase independent signal, such as a control voltage. This control voltage may be provided to a voltage controlled oscillator ("VCO") for providing an FLL, as described below in additional detail.

With the above general understanding borne in mind, various embodiments for generation of a phase independent signal are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
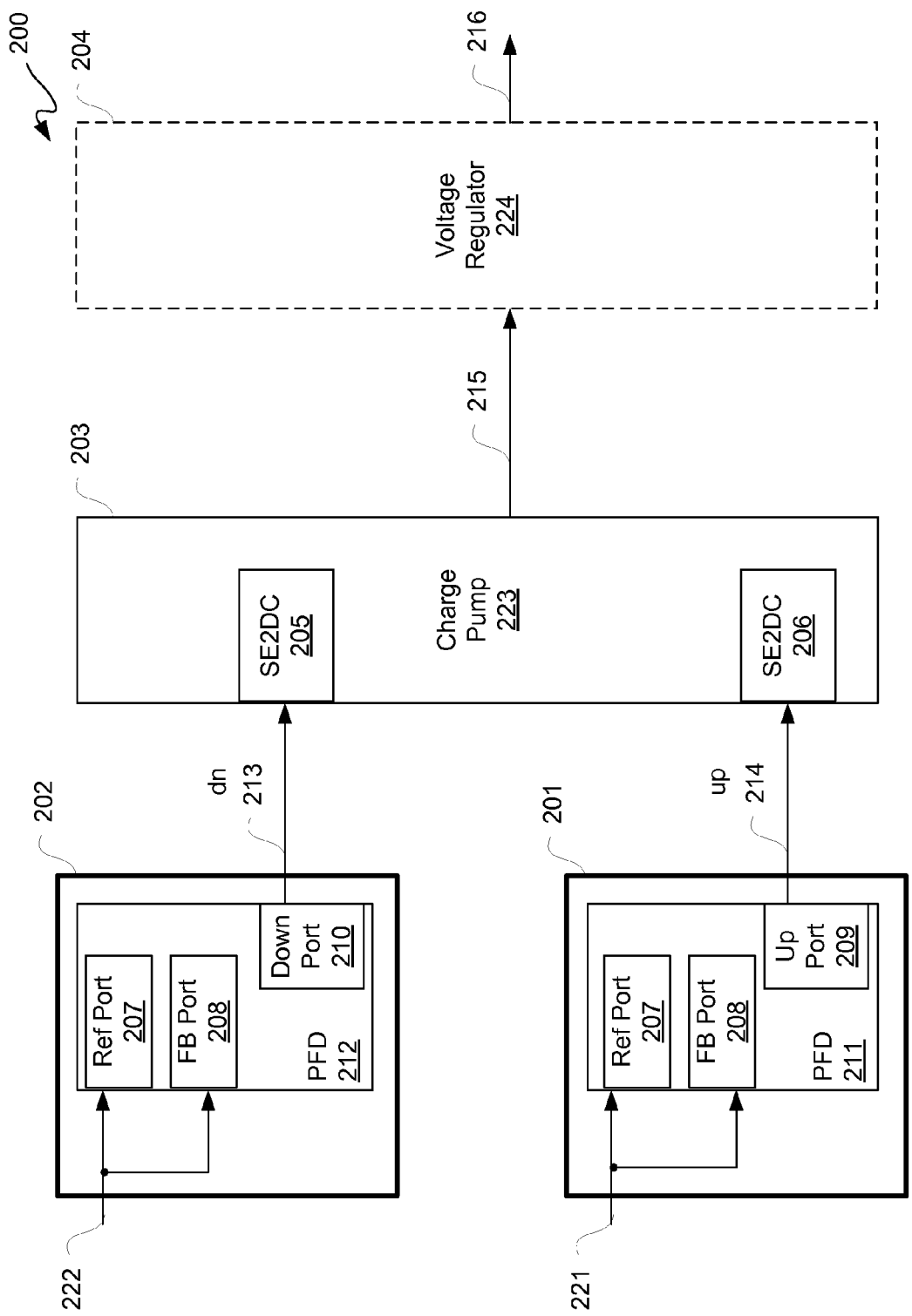
FIG. 2 is a block diagram depicting an exemplary edge density detector.

FIG. 2 is a block diagram depicting an exemplary edge density detector 200. Edge density detector includes a first pulse generator 201 and a second pulse generator 202 coupled to an accumulator 203. In this example, pulse generator 201 is a phase-frequency detector ("PFD") 211, and pulse generator 202 is a PFD 212. Furthermore, in this example, accumulator 203 is provided with a charge pump 223.

A reference frequency signal 221, such as a reference clock signal for example, is provided as input to PFD 211, and a feedback frequency signal 222, such as a voltage controlled oscillator ("VCO") output for example, is provided as an input to PFD 212. Each of PFDs 211 and 212 include a reference port 207 and a feedback port 208. Reference frequency signal 221 is provided to ports 207 and 208 of PFD 211, and feedback frequency signal 222 is provided to ports 207 and 208 of PFD 212.

Each of PFDs 211 and 212 may include an up output port and a down output port, such as down port 209 and up port 210. However, only one of such ports 209 and 210 is used by PFD 211, with an opposite one of such ports 209 and 210 being used by PFD 212. Unused output ports may be coupled to ground. Along those lines, PFD 211 uses up port 209 to provide up signal pulses for a first pulse signal 214 as an output therefrom, and PFD 212 uses down port 210 to provide down signal pulses for a second pulse signal 213 therefrom.

Charge pump 223 may be coupled to receive pulse signals 213 and 214 to provide a control voltage signal 215 as an output. Optionally, edge density detector 200 may include a signal conditioning device 204, which in this example is a voltage regulator 224. Voltage regulator 224 may be used to filter or otherwise clean up control voltage signal 215 to provide output voltage signal 216 as a cleaner version of control voltage signal 215.

Charge pump 223 may include single-ended to differential converters ("SE2DCs") 205 and 206. SE2DCs 205 and 206 may be used to allow down pulses of down pulse signal 213 and up pulses of up pulse signal 214 to be represented in contrast to one another without having to use a negative voltage.

Control voltage signal 215 is phase independent with respect to reference frequency signal 221 and feedback frequency signal 222. Along those lines, edge density detector 200 may be used in a frequency-locked loop ("FLL").

Figure 3:
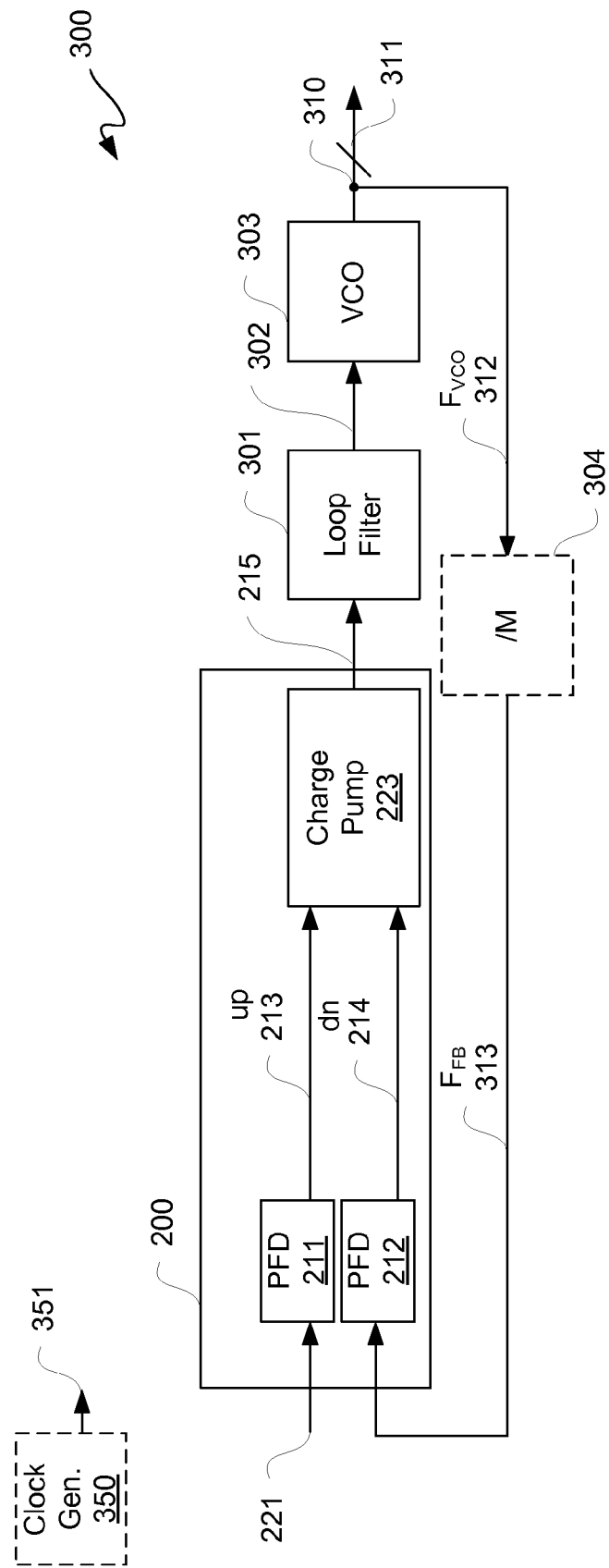
FIG. 3 is a block diagram depicting an exemplary frequency-locked loop.

FIG. 3 is a block diagram depicting an exemplary FLL 300. FLL 300 may include an edge density detector 200, a loop filter 301, a VCO 303, and optionally a divider 304. Edge density detector 200 may be coupled to receive reference frequency signal 221 and feedback frequency signal 313, as described below in additional detail. Optionally, an on-chip clock generator 350 may be used to provide a clock signal 351, and such clock signal 351 may be reference frequency signal 221. However, reference frequency signal 221 may be provided from an off-chip clock source. Furthermore, reference frequency signal 221 may be a down converted version of another signal prior to being input to FLL 300; however, it should be understood that systems where down conversion, such as a DLL, is used may benefit from edge density detection as described herein.

A first pulse generator, such as PFD 211, of edge density detector 200 may be coupled to receive reference frequency signal 221, such as a reference clock signal, and be configured to generate up pulses to provide a first pulse signal 213. A second pulse generator, such as PFD 212, of edge density detector 200 may be coupled to receive feedback frequency signal 313 and be configured to generate down pulses to provide a second pulse signal 214.

Charge pump 223 may be coupled to receive pulse signals 213 and 214 to provide control voltage signal 215. A loop filter 301 may be coupled to receive control voltage signal 215 from charge pump 223. Control voltage signal 215 is phase independent with respect to reference frequency signal 221 and feedback frequency signal 313.

Output of loop filter 301 may be a filtered voltage signal 302. VCO 303 may be coupled to receive filtered a voltage signal 302 from loop filter 301 to provide an output signal 311, which also may be provided as a feedback frequency signal or an oscillator frequency signal 312 as tapped from or at output node 310, as described below in additional detail.

VCO 303 may have associated therewith a natural frequency of operation which may be different from a frequency of operation of reference frequency signal 221. This difference in frequencies between such natural frequency of operation of VCO 303 and reference frequency signal 221 may result in an inherent phase offset. A PFD locks to a phase, and thus can override this inherent phase offset. However, having a single PFD would mean that control voltage signal 215 would be phase dependent with respect to reference frequency signal 221 or feedback frequency signal 313. However, a phase dependency in a control voltage signal of an FLL, such as FLL 300 for example, may be a liability in some situations. Along those lines, a second PFD is added to a control loop of an FLL to overcome this problem. Moreover, reference frequency signal 221 is independently provided to PFD 211, and feedback frequency signal 313 is independently provided to PFD 212. This is to contrast with providing both of these frequency signals to a same PFD. In other words, by adding phase locking with an additional PFD and separating reference and feedback frequency signals, a control voltage may be generated which is independent of phase of such reference and feedback frequency signals.

Assuming optional divider 304 is used, output of VCO 303 may be tapped at output node 310 for feedback as an oscillator frequency signal 312. Oscillator frequency signal 312 may be input to divider 304 for a divide by M operation, for M a positive number greater than zero. Output of divider 304 may be a divided down version of oscillator frequency signal 312, namely feedback frequency signal 313.

Figure 4:
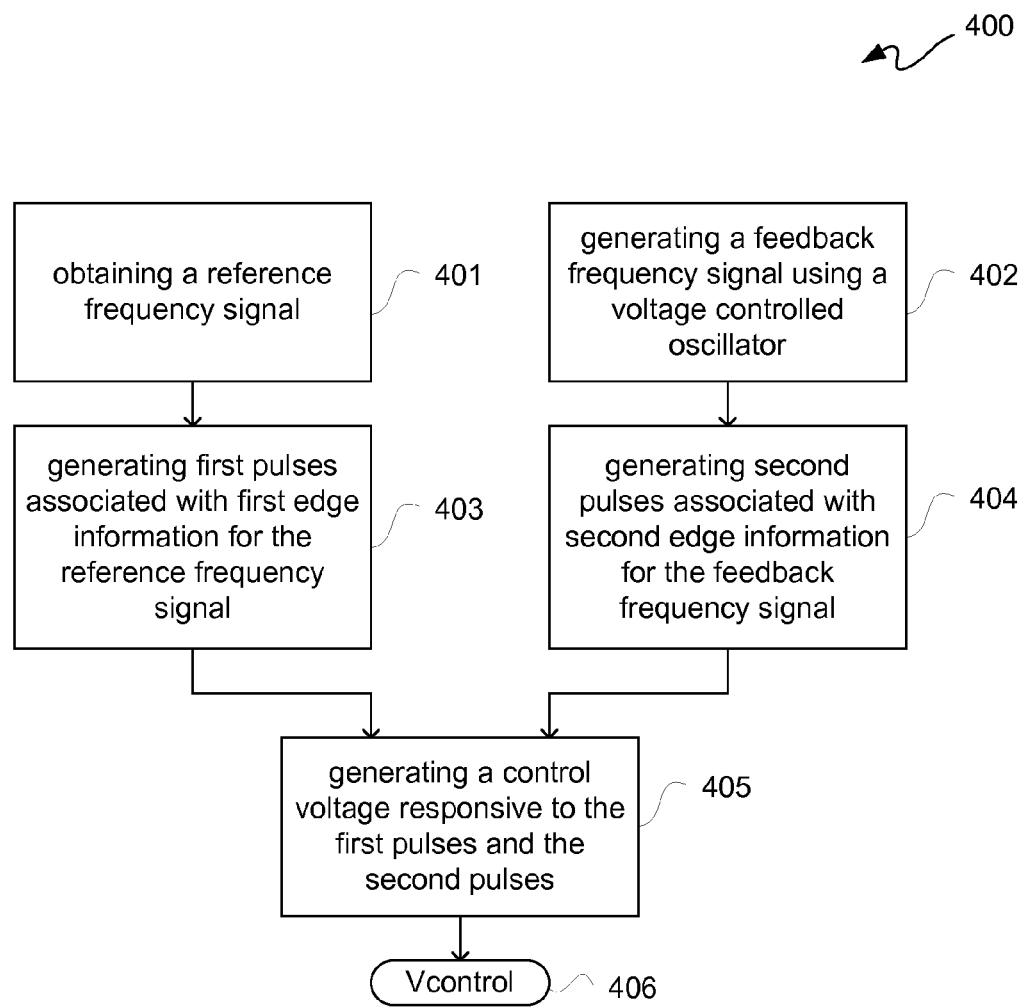
FIG. 4 is a flow diagram depicting an exemplary edge detection flow.

With the above description borne in mind, FIG. 4 is a flow diagram depicting an exemplary edge detection flow 400. At 401, a reference frequency signal is obtained, and at 402, a feedback frequency signal is generated using a VCO. Such feedback frequency signal generated at 402 may be generated responsive to such reference frequency signal obtained at 401, as such reference frequency signal may indirectly feed such VCO. Generally, receipt of a reference frequency signal will lead generation of a feedback frequency signal based thereupon, but during operation both of these signals may be processed simultaneously.

At 403, first pulses associated with a first edge information are generated for such reference frequency signal obtained at 401, and at 404, second pulses associated with a second edge information are generated for such feedback frequency signal generated at 402. At 405, a control voltage may be generated responsive to such first pulses and such second pulses respectively generated at 403 and 404. Such control voltage 406 may be output from such generation at 405, where such control voltage represents an edge density relationship between such first edge information and such second edge information.

For example, if a feedback frequency signal has a higher frequency than a reference frequency signal, then within an interval of time such feedback frequency signal may produce more edges than such reference frequency signal. In other words, within such interval of time such feedback frequency signal may have a higher edge density than such reference frequency signal. Conversely, for example, if such feedback frequency signal has a lower frequency than a reference frequency signal, then within another interval of time such feedback frequency signal may produce fewer edges than such reference frequency signal. In other words, within such other interval of time such feedback frequency signal may have a lower edge density than such reference frequency signal. An edge density of a reference frequency signal may generally be thought of as a target for which an edge density of a feedback frequency signal may be adjusted to match. In other words, if edge density of a reference frequency signal is greater than edge density of a feedback frequency signal, frequency of such feedback frequency signal may be increased to increase the number of down pulses relative to up pulses provided to a charge pump. Conversely, if edge density of a reference frequency signal is less than edge density of a feedback frequency signal, frequency of such feedback frequency signal may be decreased to decrease the number of down pulses relative to up pulses provided to a charge pump.

Such first edge information at 403 may be for a first edge density as associated with a reference frequency signal, and such second edge information at 404 may be for a second edge density as associated with a feedback frequency signal. A charge pump may be used to correct a current thereof responsive to a frequency relationship between such first pulses at 403 and such second pulses at 404 to controllably provide a control voltage or control voltage signal. Such charge pump may adjust such control voltage via adjusting a correction current to either increase or decrease such second edge density until a match occurs between such first and second edge densities. Matching of first and second edge densities by adjusting a control voltage may be bounded to a frequency range, as may vary from application-to-application. Once a match is obtained as between first and second edge densities, such control voltage signal is phase independent with respect to such reference frequency signal and such feedback frequency signal regardless of an inherent phase offset between such reference frequency signal and a natural/inherent VCO frequency. Thus, once a match is obtained, a control voltage 406 of a control voltage signal output may be used to control a regulated power rail of a VCO with phase independence.

Along those lines, for example, edge information within a VCO and reference clock may be used to generate up/down pulses. A relationship of frequency of such up/down pulses may be used to determine adjust a charge pump correction current to be used to control a regulated VCO power rail. Once frequency edge density is matched as between a reference clock and a VCO feedback frequency, relative phase offset between such VCO and such reference clock is immaterial, namely a control voltage may be provided which is phase independent of such VCO feedback frequency and such reference clock, and second-order effects of such control voltage can be offset with additional circuit blocks to become negligible.

It should be appreciated that by using an edge density detector fewer state elements may be used to provide an FLL with phase independence as described herein, and thus less power may be consumed in such pursuit. Edge density detection as described herein may be used in systems where a clock cannot be down converted to a lower frequency, such as delay-locked loops ("DLL") and other similar structures where down conversion is not an option. Furthermore, lower performance PFDs may be used to obtain an FLL with phase independence as described herein, while pushing design/timing complexity to a much easier to control cycle-path timing, such as may be associated with of back-to-back high-speed flops.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
    an edge density detector to receive a reference frequency signal and a feedback frequency signal;
    wherein the edge density detector comprises a first pulse generator, a second pulse generator, and a charge pump;
    wherein the first pulse generator is coupled to receive the reference frequency signal and is configured to generate a first pulse signal;
    wherein the second pulse generator is coupled to receive the feedback frequency signal and is configured to generate a second pulse signal;
    wherein the charge pump is coupled to receive the first pulse signal and the second pulse signal to provide a control voltage signal; and
    wherein the control voltage signal is a phase independent with respect to the reference frequency signal and the feedback frequency signal.

2. The apparatus according to claim 1, wherein the first pulse generator and the second pulse generator respectively are a first phase-frequency detector and a second phase-frequency detector.

3. The apparatus according to claim 2, wherein:
    the reference frequency signal is provided to a first reference input port and a first feedback input port of the first phase-frequency detector; and
    the feedback frequency signal is provided to a second reference input port and a second feedback input port of the second phase-frequency detector.

4. The apparatus according to claim 3, wherein:
    the first pulse signal is sourced from an up output port of the first phase-frequency detector; and
    the second pulse signal is sourced from a down output port of the second phase-frequency detector.

5. The apparatus according to claim 4, wherein the charge pump includes a first single-ended-to-differential converter and a second single-ended-to-differential converter respectively coupled to receive the first pulse signal and the second pulse signal.

6. The apparatus according to claim 2, further comprising a voltage regulator coupled to receive the control voltage signal to provide a cleaner version thereof as an output voltage signal.

7. An apparatus, comprising:
    a frequency lock loop comprising an edge density detector;
    wherein the edge density detector is coupled to receive a reference frequency signal and a feedback frequency signal;
    wherein the edge density detector comprises:
    a first pulse generator coupled to receive the reference frequency signal and is configured to generate a first pulse signal;
    a second pulse generator coupled to receive the feedback frequency signal and is configured to generate a second pulse signal;
    a charge pump coupled to receive the first pulse signal and the second pulse signal to provide a control voltage signal; and
    wherein the control voltage signal is a phase independent with respect to the reference frequency signal and the feedback frequency signal.

8. The apparatus according to claim 7, wherein the frequency lock loop further comprises:
    a loop filter coupled to receive the control voltage signal to provide a filtered voltage signal; and
    a voltage controlled oscillator coupled to receive the filtered voltage signal to provide the feedback frequency signal.

9. The apparatus according to claim 7, wherein the voltage controlled oscillator has associated therewith a natural frequency of operation different from a frequency of operation of the reference frequency signal resulting in an inherent phase offset.

10. The apparatus according to claim 7, wherein the frequency lock loop further comprises:

a loop filter coupled to receive the control voltage signal to provide a filtered voltage signal;

a voltage controlled oscillator coupled to receive the filtered voltage signal to provide an oscillator frequency signal;

wherein the voltage controlled oscillator has associated therewith a natural frequency of operation different from a frequency of operation of the reference frequency signal resulting in an inherent phase offset; and a divider coupled to receive the oscillator frequency signal to provide a divided down version thereof as the feedback frequency signal.

11. A method, comprising:

obtaining a reference frequency signal;

generating a feedback frequency signal responsive to the reference frequency signal;

wherein the feedback frequency signal is provided using a voltage controlled oscillator;

generating first pulses associated with first edge information for the reference frequency signal;

generating second pulses associated with second edge information for the feedback frequency signal; and generating a control voltage signal responsive to the first pulses and the second pulses;

wherein the control voltage signal represents an edge density relationship between the first edge information and the second edge information;

wherein the generating of the control voltage signal includes adjusting the control voltage signal output toward a match in edge densities respectively associated with the first edge information and the second edge information.

12. The method according to claim 10, wherein the first pulses and the second pulses are respectively generated with a first phase-frequency detector and a second phase-frequency detector.

13. The method according to claim 12, wherein the control voltage signal is a phase independent with respect to the reference frequency signal and the feedback frequency signal when the edge densities match one another.

14. The method according to claim 12, wherein the voltage controlled oscillator has associated therewith a natural frequency of operation different from a frequency of operation of the reference frequency signal resulting in an inherent phase offset.

15. The method according to claim 14, wherein:

the first pulses and the second pulses are respectively generated with a first phase-frequency detector and a second phase-frequency detector;

the first edge information is for a first edge density of the reference frequency signal;

the second edge information is for a second edge density of the feedback frequency signal; and the first edge density and the second edge density are the edge densities.

16. The method according to claim 15, wherein the control voltage signal is generated with a charge pump coupled to receive the first pulses and the second pulses.

17. The method according to claim 16, wherein:

the charge pump corrects a current thereof responsive to a frequency relationship between the first pulses and the second pulses to controllably provide the control voltage signal; and the control voltage signal controls a regulated power rail of the voltage controlled oscillator.

18. The method according to claim 16, wherein:

the adjusting of the control voltage signal to have the first edge density and the second edge density match one another is for being within a frequency range; and the control voltage signal is phase independent with respect to the reference frequency signal and the feedback frequency signal regardless of the inherent phase offset.

19. The method according to claim 18, further comprising cleaning the control voltage with a loop filter.

20. The method according to claim 18, further comprising cleaning the control voltage with a voltage regulator.

* * * * *